United States Patent
Forejt et al.

(10) Patent No.: US 8,929,121 B2
(45) Date of Patent: Jan. 6, 2015

(54) REFERENCE AND READ OTP SENSORS

(75) Inventors: Brett Earl Forejt, Garland, TX (US); David John Baldwin, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 322 days.

(21) Appl. No.: 13/451,977

(22) Filed: Apr. 20, 2012

(65) Prior Publication Data
US 2013/0194856 A1 Aug. 1, 2013

Related U.S. Application Data

(60) Provisional application No. 61/594,449, filed on Feb. 3, 2012, provisional application No. 61/592,398, filed on Jan. 30, 2012.

(51) Int. Cl.
*G11C 17/00* (2006.01)

(52) U.S. Cl.
USPC .............. 365/104; 365/189.05; 365/189.07; 365/225.7; 365/210

(58) Field of Classification Search
CPC .............. G11C 7/14; G11C 7/16; G11C 7/18; G11C 7/22; G11C 7/062; G11C 7/1051; G11C 7/1078; G11C 7/106; G11C 7/1057; G11C 29/027; G11C 29/785; G11C 2216/26

USPC ............ 365/104, 189.05, 189.07, 225.7, 210
See application file for complete search history.

(56) References Cited

U.S. PATENT DOCUMENTS

| | | | |
|---|---|---|---|
| 6,728,137 B1* | 4/2004 | Lin | 365/185.05 |
| 7,342,836 B2* | 3/2008 | Taheri et al. | 365/189.05 |

OTHER PUBLICATIONS

COP87L88GW microCMOS One-Time Programmable (OTP) Microcontroller, Preliminary May 1996, 1996 National Semiconductor Corporation, http://www.national.com, Texas Instruments Literature No. SNOS782A, pp. 1-44.

* cited by examiner

*Primary Examiner* — Tha-O H Bui
(74) *Attorney, Agent, or Firm* — Alan A. R. Cooper; Frederick J. Telecky, Jr.

(57) ABSTRACT

The present disclosure provides a reference one time programmable (OTP) cell, wherein the reference OTP cell can generate a reference bias current in at least a programmed-on configuration; a current mirror coupled to an output of the OTP cell, wherein the current mirror includes at least two gate-coupled field effect transistors (FETs); wherein a current gain of a second of the two FETS is a fraction less than one of a first of the at least two gate-coupled FETs; a programmable OTP memory bit element (OTPMBE) coupled to an input of the current mirror; and a comparator having an input coupled to a node between the OTPMBE and the current mirror.

16 Claims, 7 Drawing Sheets

*FIG. 1Bii*
*(PRIOR ART)*

REFERENCE AND READ OTP SENSORS

PRIORITY

This Application claims priority to U.S. Provisional Application No. 61/592,398, filed Jan. 30, 2012, entitled "OTP Sensor", the contents of which are incorporated by reference in its entirety, and further to U.S. Provisional Application No. 61/594,449, filed Feb. 3, 2012, entitled "OTP Sensor", the contents of which are also incorporated by reference in its entirety.

TECHNICAL FIELD

This Application is directed, in general, to use of a programmable logic element as a current reference source for a second programmable logic element, and, more specifically, to a reference one time programmable (OTP) cell as a current reference source to another OTP memory.

BACKGROUND

OTP memories are an ever-increasingly important component of modern electronics. Typically OTP memories require a bias current to perform the read operation. In older, well controlled processes, the bias current range required is 10 times or greater. In newer (leaky) process, the bias current range has narrowed to three times between a bias current and an OTP memory current, and is shrinking Tightening ranges require a precision current reference to maintain a reliable read function. A bandgap style reference is usually employed to create a reference current.

However, there are general problems with bandgap style current references. For example, bandgaps can be large in area, use significant current, require extra devices (bipolar) in the design, and can have significant start up time requirements.

Therefore, there is a need in the art to address at least some of the issues associated with conventional OTP bit measurement circuits.

SUMMARY

A first aspect provides an apparatus, comprising: a reference one time programmable (OTP) cell, wherein the reference OTP cell can generate a reference bias current in at least a programmed-on configuration a current mirror coupled to an output of the OTP cell, wherein the current mirror includes at least two gate-coupled field effect transistors (FETs); wherein a current gain of a second of the two FETS is a fraction less than one of a first of the at least two gate-coupled FETs; a programmable OTP memory bit element (OTPMBE) coupled to an input of the current mirror; and a comparator having an input coupled to a node between the OTPMBE and the current mirror.

A second aspect provides a reference one time programmable (OTP) cell, wherein the reference OTP cell can generate a reference current in at least a programmed-on configuration upon a burning in of a field effect transistor (FET) within the reference OTP cell; a current mirror coupled to an output of the reference OTP cell, wherein the current mirror includes at least two gate-coupled FETs; wherein a current gain of a second of the two FETS is a fraction less than one of a first of the at least two gate-coupled FETs; a plurality of programmable OTP memory bit elements (OTPMBEs) coupleable to an input of the current mirror; and comparator having an input coupled to a node between the OTPMBE and the current mirror, wherein the reference OTP cell and the plurality of OTPMBEs are fabricated substantially simultaneously.

A third aspect provides an apparatus, comprising: a reference memory logic, wherein the reference memory logic can generate a reference current when burned in; a current mirror coupled to an output of the reference memory logic to receive the reference current; a programmable memory bit (PMB) logic coupled to an input of the current mirror; and a comparator having an input coupled to a node between the PMB logic and the current mirror.

BRIEF DESCRIPTION OF THE DRAWINGS

Reference is now made to the following descriptions:

FIG. 1Bii illustrates a read line and a write line coupled to a prior art plurality of OTP memory elements coupleable to a single comparator;

DETAILED DESCRIPTION

Figure 1A:
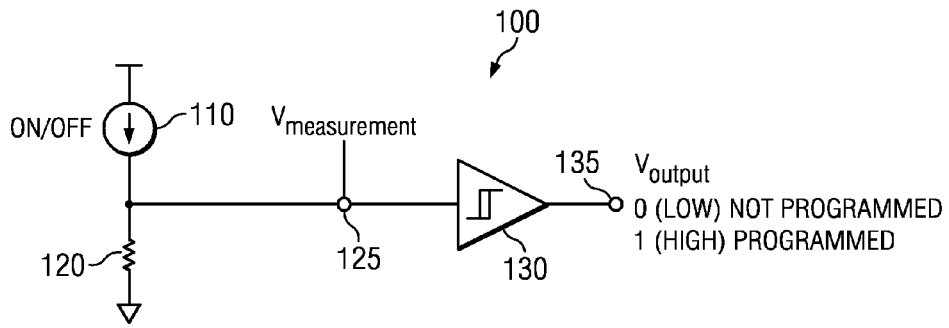
FIG. 1A illustrates a first prior art OTP memory element reader circuit.

Turning to FIG. 1A, illustrated a prior art OTP bit measurement circuit 100. In the circuit 100, an OTP bit memory element (OTPBME) 110, a current source, is coupled to a resistor 120 Typically, the value of the resistor is set by the supply voltage and the maximum Ioff current, such as might be seen from an unprogrammed OTP. R=VDD/(2*Ioff_max); for example, 500 kOhms. The resistor 120 is coupled to ground. The OTPBME 110 is coupled at a node 125, Vmeasurement, to an input of a comparator 130. An output of the comparator is coupled to a Voutput node 135. For more information about OTP sensors themselves, please see, for example, "COP8&L88GW microCMOS One-Time Programmable (OTP) Micrcontroller"; Literature Number: SNOS782A, Copyright 2011, Texas Instruments Incorporated, which is hereby incorporated by reference in its entirety.

Generally, the OTPBME circuit 100 of FIG. 1A can work as follows. The OTPBME 110 is programmed either as an "on" state ("programmed") or an "off" state ("not programmed").

If the OTPBME 110 is programmed as an "off," or "not programmed", substantially no, or very little, such as for example, 100 nanoAmps, current is flowing from the OTPBME 110 through the resistor 120, and therefore Vmeasurement node 125 is at a ground voltage, and therefore the comparator 130 outputs a "0" low. If the OTPPBME 110 is programmed as an "on" or "programmed", current is following through the resistor 120, such as for example, 60 micro-Amps, and therefore Vmeasurement node 125 approaches a voltage proportional to the current of the OTPBME 110, and therefore the comparator 130 outputs a "1" high. VDD is generally product and process dependent. But can be, for example, 3.6V.

Figure 1B:
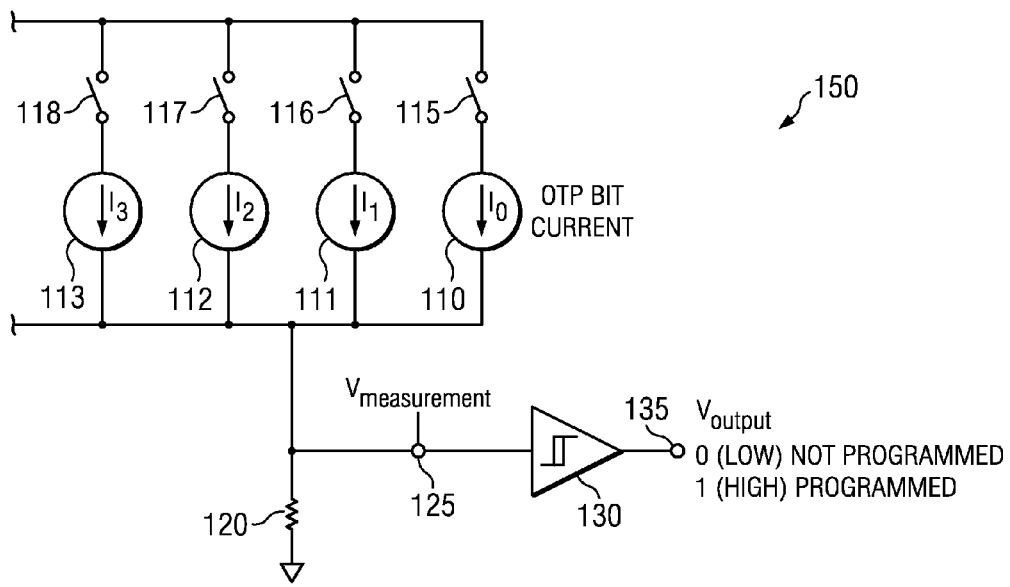
FIG. 1Bi illustrates a prior art plurality of OTP memory elements coupleable to a single comparator.

FIG. 1Bi illustrates an array 150 of OTPBME that are selectively couple-able to be read by the comparator 130. In the array 1500, an OTPBME 110-113 can be selectively coupled to the resistor 120 and the comparator 130 through its corresponding switch 115-118.

FIG. 1Bii illustrates an array 170 that employs a read line 171 and a write line 173. In the array 170, OTPBME current sources The array 170 is a densely packed arrangement of minimum sized PMOS floating gate devices (i.e. OTP cells) There are as many read/write lines 171, 173 as there are bits in a word and the corresponding bit in each word are shorted. Each word has a unique read line 171 which activates the entire word an only that word so that the read/write lines 171, 173 may only operate on the selected bit. This defines that the read/write lines are a shared bus amongst all the words.

However, there are problems with the circuits 100, 150, and 170 of FIGS. 1A-1Bii that rely upon the resistor 120. These problems include a constant current bleed through the resistor 120, that the resistor 120 value does not track the variation of the OTP for either programmed or unprogrammed states. The size of the resistor 120 must be precise and is set by the Ioff and Ion of the OTP. Finally, as understood by the present inventors, the lifetime data retention has no tracking between the 'read resistor' and the OTP current values. Therefore, in the prior art, alternative approaches have been devised, as shall be discussed in prior art FIG. 2.

Figure 2:
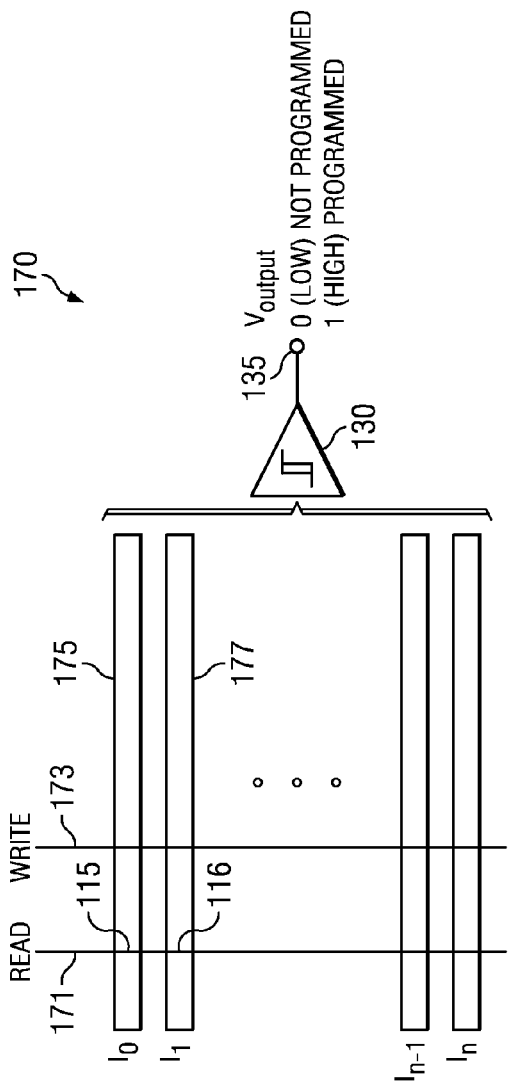
FIG. 2 illustrates a second prior art OTP memory element reader.
Figure 2:
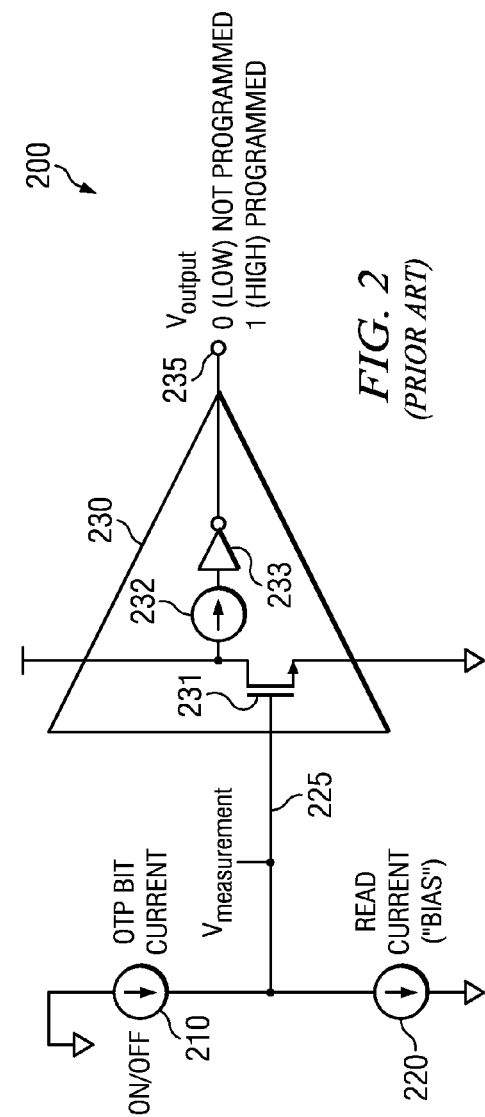

FIG. 2 illustrates a prior art OTP bit measurement circuit 200. The circuit 200 includes an OTPBME 210, a current source, which is coupled to second current source 220, a current sink, which generates a read ("bias") current. In the circuit 200, the on current of the OTPMBE 210 is several times higher in magnitude than the read current sink 220, which can be of a magnitude of ten or a hundred or more. The current sink 220 is coupled to ground. The output of the OTPBME 210 is coupled at a node 225, Vmeasurement, to an input of a comparator 230. An output of the comparator 230 is coupled to a Voutput node 235.

In the circuit 200, the comparator 230 has a gate of a negative channel field effect transistor (NFET) 231, a type of metal-oxide semiconductor field effect transistor (MOS-FET), coupled to the Vmeasurement node 225, a drain of the NFET 231 coupled to a current source 232 and a high voltage rail, and a source of the NFET 231 coupled to ground. The comparator 230 also includes an inverter 233 coupled to the current source 232, and the inverter 233 is also coupled to the output node 235.

The circuit 200 can work as follows. The OTPBME 210 is programmed either as an "on" state ("programmed") or an "off" state ("not programmed.").

If the OTPBME 210 is programmed as an "off" or "not programmed", the OTPBME stores a value or a "0", substantially no current, or very little current, perhaps a few nano-amperes, is flowing from the OTPBME 210 through the 220 read current source 220 to ground, and therefore Vmeasurement node 225 is at a ground voltage; therefore, the comparator 230 outputs a "0" low.

However, if the OTPBME 210 is programmed as an "on" or "programmed", the maximum current through the OTPBME 210 is significantly higher than the maximum amount for which the read current sink 220 is configured. Therefore, a voltage across the read current sink 220 quickly approaches a maximum voltage differential allowable across both the OTPBME 210 and the read current sink 220 in series. A voltage is set by the power supply 'VDD' and in our design is less than or equal to 5.5 V, thereby having the 5.5 volts or less across the read current sink 220, again driving the Vmeasurement node 225 close to a high voltage rail, and then the Voutput node 235 is also high.

In the prior art circuit 200, the read current sink 220 is a bandgap current sink. However, there are some general problems with bandgap style current references. For example, bandgaps can be large in area, use significant current, require extra devices (bipolar) in the design, and can have significant start up time requirements.

Figure 3A:
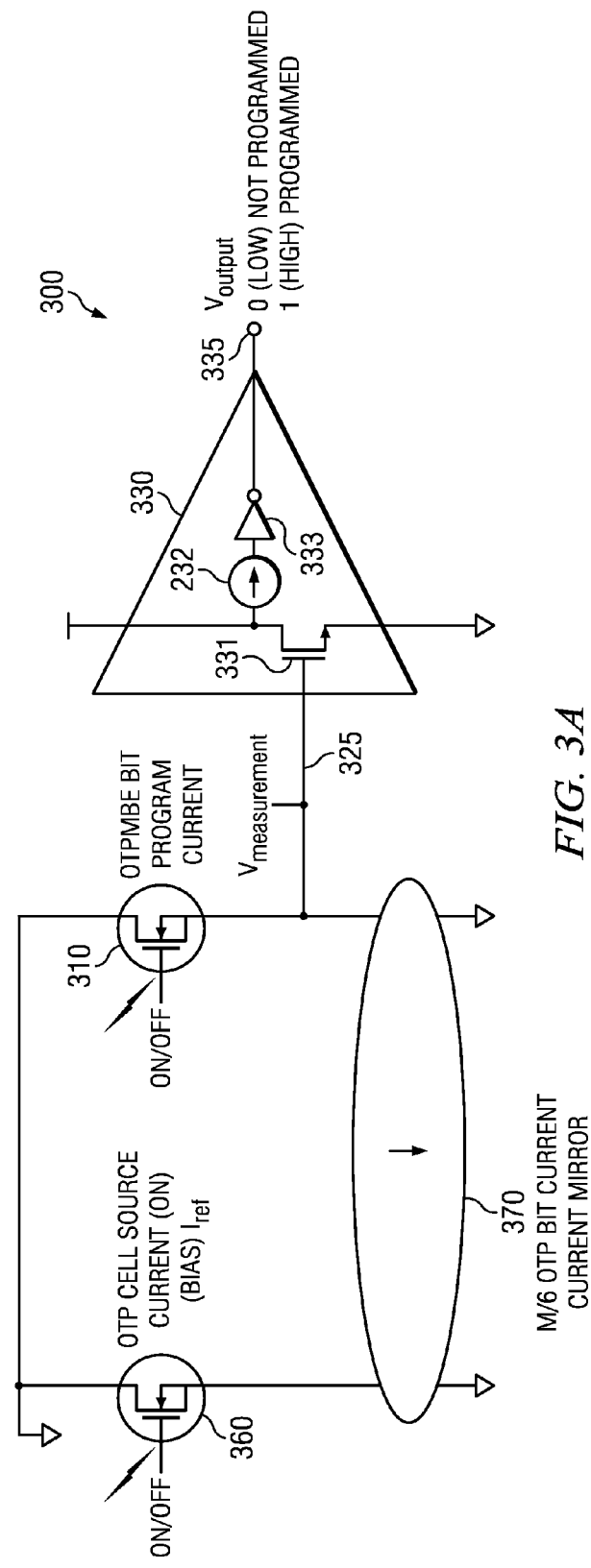
FIG. 3A is an illustration of circuit employing a reference OTP cell that generates a reference current constructed according to the principles of the present disclosure.

FIG. 3A is an example of a circuit 300 that addresses at least some of the issues associated with prior art. In the circuit 300, a reference OTP, a OTP cell 360, generates the bias current during an OTPBME 310 read operation. Unlike the prior art, which required a non-OTPMBE to generate a reference circuit, the circuit 300 generates a reference current by an OTPMBE that is used to drive a Vmeasurement 325 node.

As understood by the present inventors, all previous ways of generating a read current, such as by the current source 220 have been from unmatched sources. That is that they have been from resistors, bandgaps, or other well know current source methods.

The circuit 300, however, uses an identically manufactured element of the OTPMBE 310, the OTP cell source current, and to generate a read/bias current, and therefore is intrinsically more robust and is also can be far more straightforward to implement. It is smaller than all but perhaps the simplest prior art which is the resistor. An in that case, the area is comparable. In one aspect, In the circuit 300, the comparator 330 comprises a gate of an NFET 331 coupled to the Vmeasurement node 325, a drain of the NFET 331 coupled to a high voltage rail and a current source 232, and a source of the NFET 331 coupled to ground. The current source 332 is also coupled to an anode of an inverter 333, a cathode of which is coupled to a Voutput 335.

Generally, the circuit 300 can work as follows. The OTP cell 360 generates the bias current. This bias current is then mirrored and divided down by a current mirror 370, which in the circuit 300 is divided down by a factor of six, but other dividers can be used. An input to the current mirror 370, a current sink, is then coupled to an output of the OTPBME 310. If the OTPMBE 310 is programmed as off, then the OTPBME 310 will not generate substantial current, the current mirror 370 draws no current, and the Vmeasurement bit 325 is driven towards ground. However, if the OTPBME is programmed as "on," then the OTPBME 310 will not generate substantial current, the current mirror 370 is configured to be able to sink only a fraction of that. Therefore, a voltage across the read current sink 320 quickly approaches a maximum voltage differential allowable across both the OTP cell 310 and the read current sink in series.

Indeed, in the prior art, as appreciated by the present Applicants, the OTP programmable current of an OTP intended as a readable memory element could be several orders of magnitude higher than a that of a coupled current sink, Ion minimum over lifetime>100 uA; Ion_maximum over lifetime<500 nA for older processes. However, as process technologies have advanced, the current generated by OTP programmable bit elements has dropped, even when they are programmed on to be read as a high or "1" value, so that the current generated by the OTPM in the prior art and the current sink are within an order of magnitude of each other, creating problems for the comparator, especially considering such factors as manufacturing variability again of elements, and overall different behaviors of CMOS transistors (used in logic) and bipolar junction transistor (BJT) transistors (typically used in analog).

In one aspect, the OTP cell source 360 and the OTPMBD 310 are manufactured substantially simultaneously, i.e. during the same fabrication steps. Moreover, he OTP cell source 360 and the OTPMBD 310 are on the same chip and are located in the same area. The OTP cell source 360 and the OTPMBD 310 are within 10 um of each other. The OTP cell source 360 and the OTPMBD 310 can also be directly adjacent and spread throughout a larger array (100's of words) to provide better matching across an array.

This approach of circuit 300 has a number of advantages over the prior art circuit 200 of FIG. 2. The circuit 200 requires another outside source to generate the current, outside in a sense of it is not a logic element, and also a bipolar junction transistor.

Moreover, employment of a memory element, such as an OTP, for use as a current source the OTP cell 360, or a substitution of another one time programmable element of programmable memory bit (PMB) logic, such as an EPROM element or EEPROM element, can add a factor of reliability not found in the prior art. For example, unlike prior art current sources bias current references for these elements, as the OTP cell 360 reference bias current is manufactured at the same time as other OTMBE sensors, this approach to manufacturing the circuit 300, as being manufactured during a same batch would typically impart distinctive structural characteristics to the circuit 300 that would allow the OTP reference cell to more accurately track all other programmed OTP cells for process, voltage, and temperature which creates a very robust solution, as these rates would typically map substantially to each other within a same batch, as opposed to prior art devices.

The above matching of decay rates between a bias current Iref OTP cell 360 and the OTPMBE 310 is also demonstrated when comparing MOSFET configuration of one time programmable memory elements, such as OTPBME's, to that of a hypothetical BJT bias reference current generating. By using a programmed OTP bit to generate a reference current for read, for the OTP cell 360, a reliable read amplifier can be designed which does not require any outside current reference. Typically, a construction of a PMOS MOSFET can be used of the OTP cell source current 360 with its gate floating.

In alternative aspects, an OPT 310 or the OTP cell source 360 can be an NMOS and is not limited to PMOS. A programmed NMOS OTP would constitute a logical 0 and its default un-programmed value would be a logical 1. However, a logic inversion can be added to the PMOS aspect, to swap the logical values for programmed versus unprogrammed.

In the circuit 300, the manufacturing steps are that the source OTP element 360 and the programmable OTP 310 element are being manufactured at a same time, and therefore have very similar/matching characteristics.

This approach of circuit 300 is very attractive to large scale digital designs which require non volatile memory (NVM). Even with systems which have a current reference, this solution simplifies the startup sequencing. For example, when using prior art current sources a user would be constrained to wait for the current source/sink to settle before reading. Now, the setting time of a reference current is substantially equal to that of the OTP itself. In other words, removes the extra complication of having to enable the reference current for the chip just to read the OTP. Also, the OTP cell 360, the current mirror 370, the OTPMBE 310, and the comparator 330 can be all integrated in a single integrated circuit.

Moreover, generally, a bias reference current no longer has to be routed into the digital core to an OTP block from the analog world, and therefore the circuit is a self-contained reference using a single OTP bit, and a small supporting circuit of the current mirror, such as 15 times a size of a minimum MOSFET.

Moreover, the circuit 300 removes "cross boundary" layout of analog current into the digital OTP cell of prior art OTP read/sensor circuits, as only OTP of the same type are being employed to be both a memory and a reference current for the circuit, a function of a current source has been retained, but with an elimination of a separate, different current source, such as a BJC broadband current source, eliminated. Moreover, power is conserved, as CMOS circuits, such as that use MOSFETs, are typically more power efficient than BJT's. The circuit 300 also removes the required logic and control which would allow the reference circuit to be enabled and disabled at the appropriate times. This can be a challenging issue; many chips have had 'bugs' in this regard. The OTP is simply enabled and then read after a small delay, such as 10 us.

Moreover, unlike prior art current sources, the OTPBME are very small and compact. This change in size, for example, can be several orders of magnitude, from several hundred square millimeters to a few square millimeters, such as three. By using a pre-programmed OTP bit to generate a reference current for read, a very compact & reliable read amplifier can be designed which does not require any outside reference.

Figure 3B:
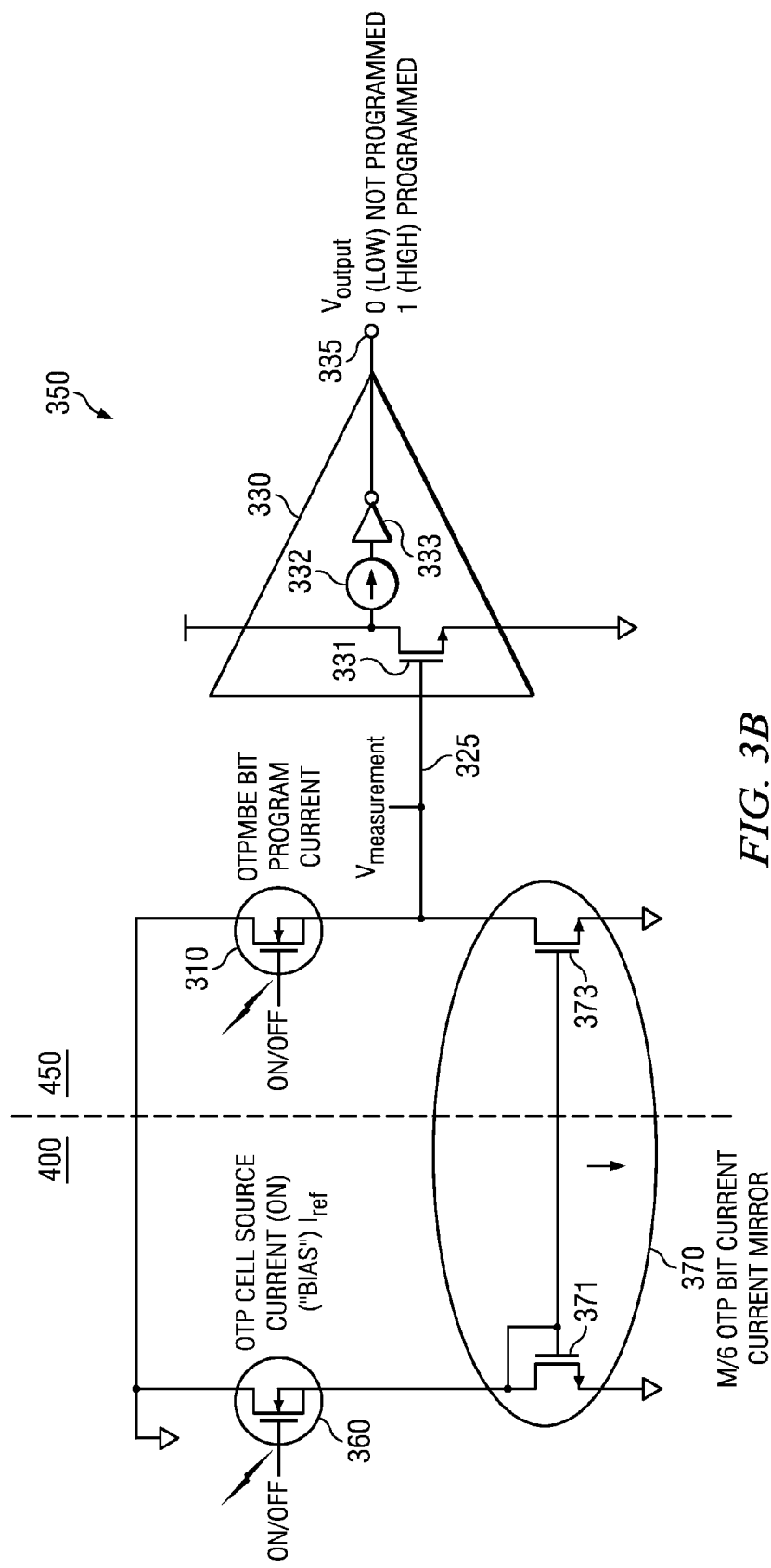
FIG. 3B is an illustration of circuit employing a reference OTP cell that generates a reference current conveyed to a current sink constructed according to the principles of the present disclosure.

FIG. 3B illustrates one embodiment of the current mirror 370 in more detail. The current mirror 370 includes a first NFET 371 coupled to an output of the OTP cell 360 that generates a source/reference current 360. A drain of the first NFET 371 is coupled to a gate of the first NFET 371, and a source of the NFET 371 is coupled to a ground. The gate of the first NFET 371 is coupled to a gate of a second NFET 373. A drain of the second NFET 373 is coupled to an output of the OTPBME 310. A source of the second NFET 373 is coupled to the ground. In the current mirror 370, the current gain between the first NFET 371 and the second NFET 373 is 6:1, although other ratios can be employed if they allow the comparator to differentiate between an off an on due to substantially higher current amount of a programmed on OTPBME 310 and the current mirror 370.

The circuit 350 is further subdivided into a circuit 400 and a circuit 450, to be discussed in FIGS. 4A and 4B, below.

Figure 4A:
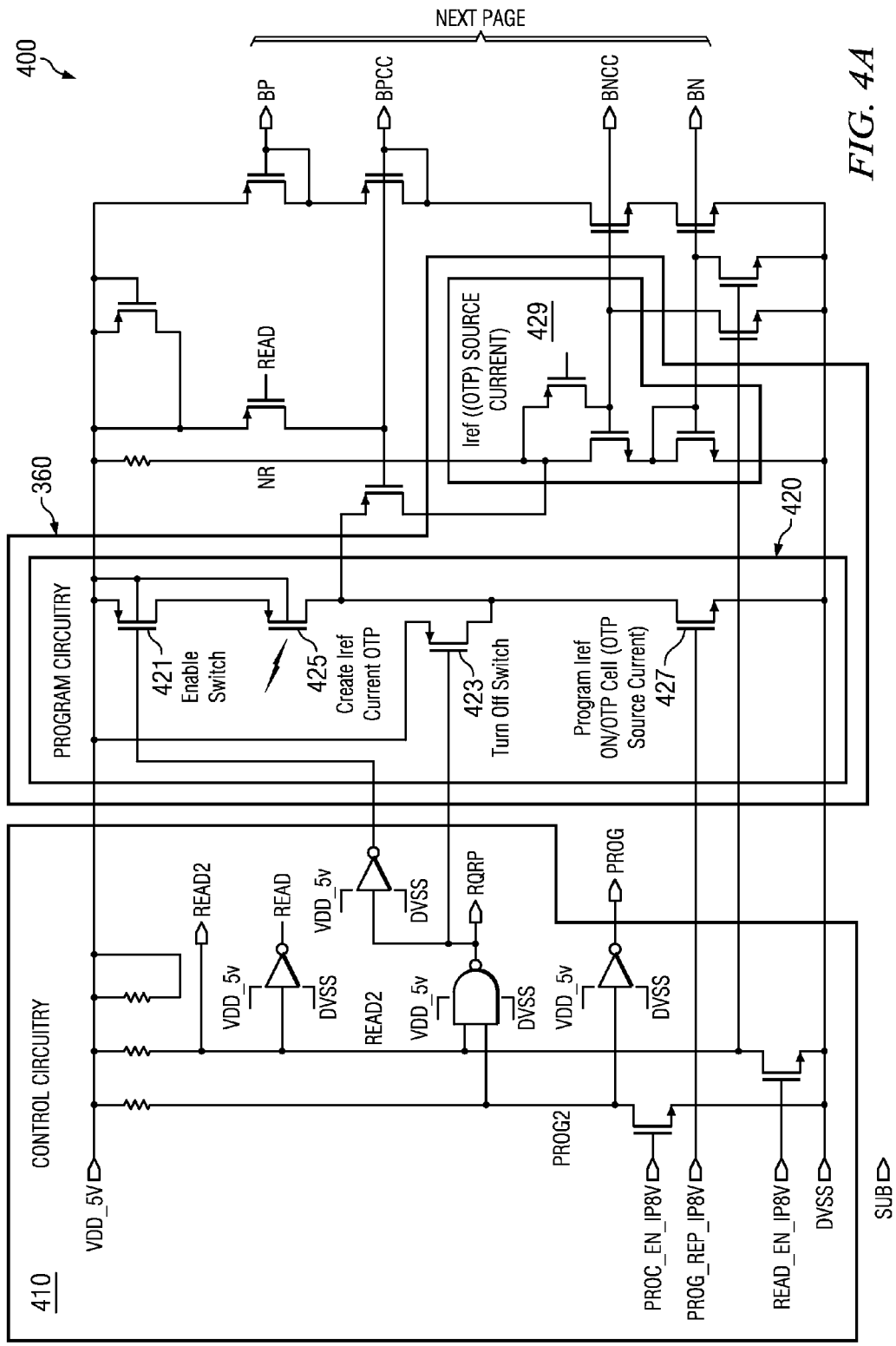
FIGS. 4A and 4B are further illustrations of circuit of FIG. 3B employing a reference OTP cell that generates a reference current conveyed to a current sink constructed according to the principles of the present disclosure.

FIG. 4A illustrates a circuit diagram of an OTPBME reader circuit 400 that uses at least aspects of the circuit 350 of FIG. 3B, the first half of the circuit 350.

In the circuit 400, a control circuitry 410 is coupled to the OTP cell 360 current source Iref ("bias" reference). The OTP cell 360 includes a program circuitry 420 and a source current circuit 429. The program circuitry 420 includes an enable switch PFET 421 that turns on the OTP cell 360, a turn off switch PFET 423 that can turn off the OTP cell 360, a PFET 425 that creates an Iref/bias current, and a program switch NFET 427, that programs the PFET 425 (this is the OTP used as the reference device). The OTP cell 360 also includes an Iref source current circuit 429, which includes NFET 371 of FIG. 3B, wherein 425 is the reference OTP device and 429 is the diode-connected side of a current mirror. These signals are then changed in relative voltages and conveyed to one of a circuit 450, as described in FIG. 4B.

Figure 4B:
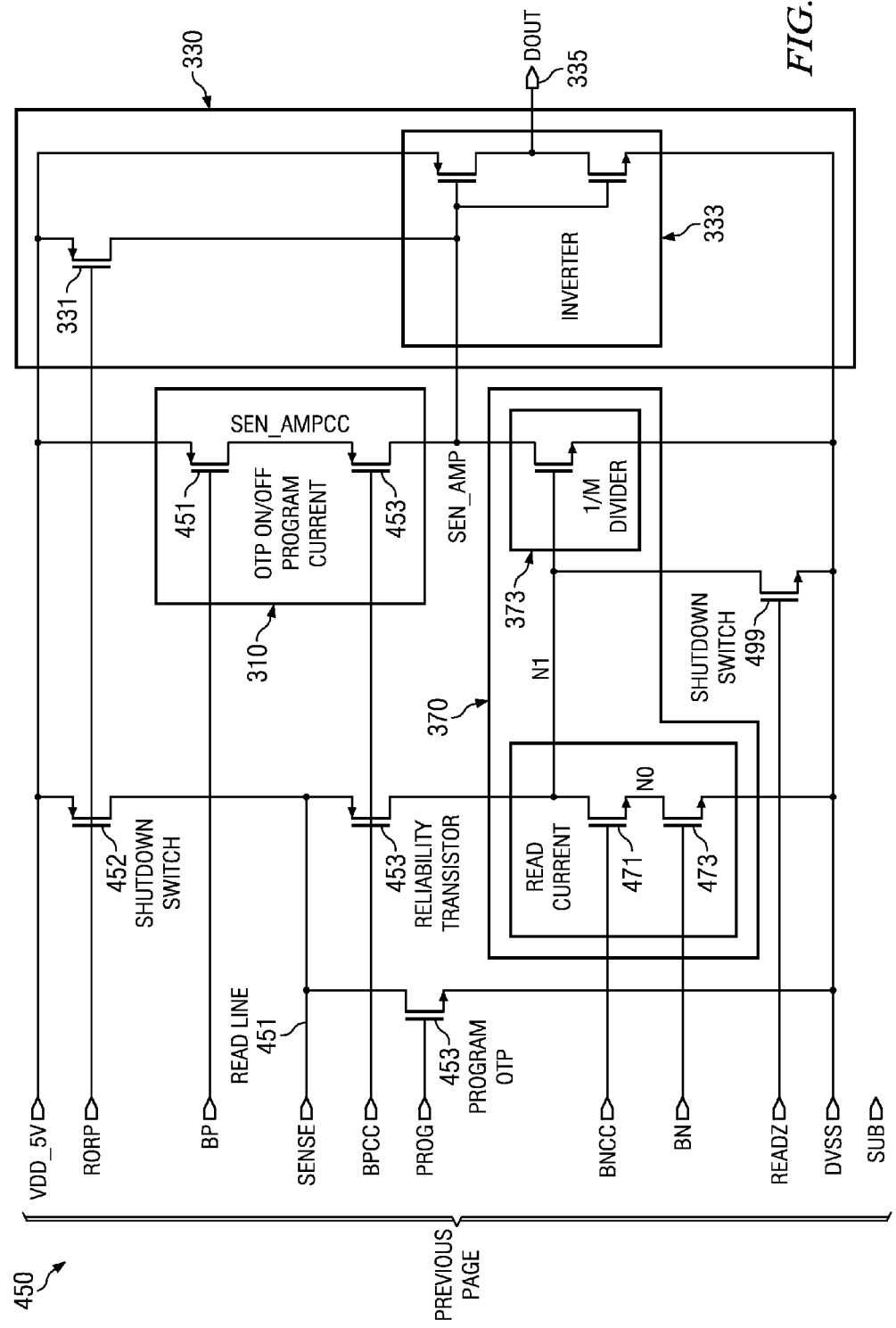

FIG. 4B illustrates a circuit 450, a second half of the circuit 350. Please note that a given array, such as will be described in FIG. 5, can have a number of circuits 450, each one corresponding to its own OTPMBE 310.

The circuit 450 includes a read line 451, and the read line 451 is coupled to a program NFET 453. NFET 453 is the device which is used to program the target OTP bit if desired. The read line 451 is coupled into a source of a shutdown switch 452, and a reliability transistor 453, both of which are PFETs.

A source of the reliability switch 453 is coupled into an input of the current mirror 370, as are a pair of positive and negative signals along BN and BNCC conveyed from the Iref bias of the OTP cell 360 to a pair of NFETs 471, 473 of the current mirror 370. The current mirror 370 further includes the 1/M divider transistor 373 of FIG. 3B. A drain of the 1/M divider transistor 373 is then coupled to the OTPMBE 310. A shutdown switch 499 is also coupled to the current mirror 370 and a source of the 1/M divider.

The OTPMBE 310 includes both a PFET 451, which provides the on and off current as to whether the 310 is indeed, programmed and the PFET 453, which is used to "burn in" the NFET 310. The OTPMBE 310 is then coupled to the comparator 330, which includes the NFET 331, and the inverter 333, which is coupled to output node 335.

Figure 5:
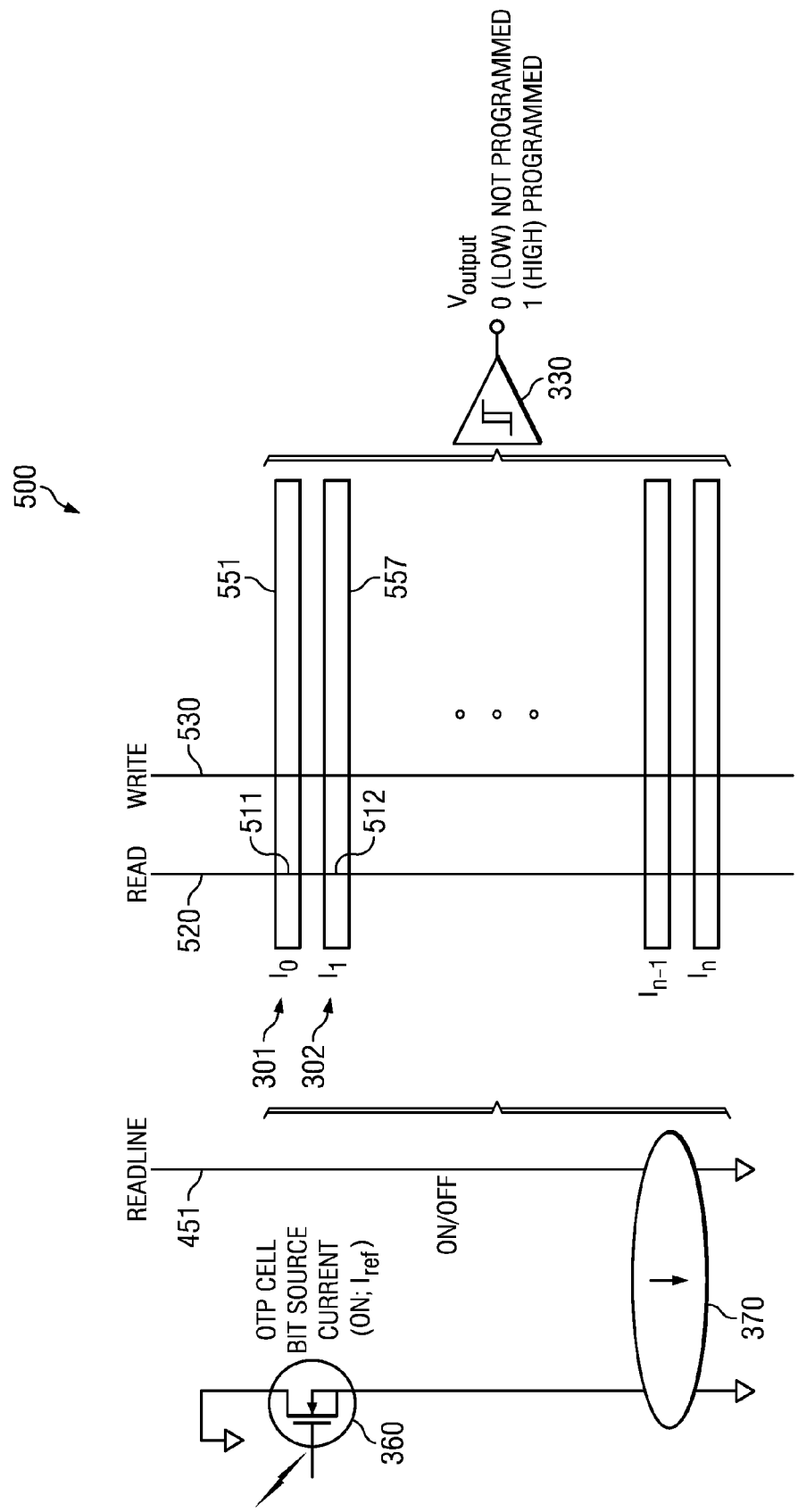
FIG. 5 is an illustration of illustrates a read line and a write line that are at a same OTP per bit location in the word.

FIG. 5 illustrates is a read line 520 and a write line coupled to a plurality of OTP memory elements, 551-557 coupleable to a single comparator, also coupleable to an OTP memory element used as a reference current constructed according to the principles of the present disclosure; For example: if one has an 8 bit word, the first memory (OTP) bit of all words is shorted together and the WORDLINE selects the bit on which one is operating. Then depending upon READ or WRITE, one either supplies a reference current (READ) or short the word line to ground (WRITE). One aspect of FIG. 5 has 8 words with 8 bits per word, another with 12 bits per word, and another with 16 words.

What is claimed is:

1. An apparatus, comprising:
   a reference one time programmable (OTP) cell, wherein the reference OTP cell can generate a reference bias current in at least a programmed-on configuration;
   a current mirror coupled to an output of the reference OTP cell, wherein the current mirror includes at least two gate-coupled field effect transistors (FETs);
   a programmable OTP memory bit element (OTPMBE) coupled to an input of the current mirror; and
   a comparator having an input coupled to a node between the OTPMB and the current mirror,
   wherein the reference OTP cell and the OTPMBE are fabricated substantially simultaneously;
   wherein a long-term decay of the reference current of the reference OTP cell is substantially matched with a long-term decay of the reference current of the OTPMBE due at least in part to said substantially simultaneous fabrication.

2. The apparatus of claim 1, wherein the reference OTP cell, the current mirror coupled to an output of the reference OTP cell, the programmable OTPMBE, and the comparator are all integrated in a single integrated circuit.

3. The apparatus of claim 1, wherein:
   if the OTPMBE is programmed on, an input voltage at the comparator approaches that of a high level voltage rail of the reference OTPMB logic, and
   if the OTPMBE is programmed off, an input voltage at the comparator approaches that of a ground of the apparatus.

4. The apparatus of claim 1, wherein the OTPMBE is programmed "on" (logic high).

5. The apparatus of claim 1, wherein the reference OTP cell is turned on upon a programming of a MOSFET within the reference OTP cell.

6. An apparatus, comprising:
   a reference one time programmable (OTP) cell, wherein the reference OTP cell can generate a reference current in at least a programmed-on configuration upon a burning in of a field effect transistor (FET) within the reference OTP cell;
   a current mirror coupled to an output of the reference OTP cell, wherein the current mirror includes at least two gate-coupled FETs;
   a plurality of programmable OTP memory bit elements (OTPMBEs) coupleable to an input of the current mirror; and
   a comparator having an input coupled to a node between the OTPMBE and the current mirror, wherein the reference OTP cell and the OTPMBE are fabricated substantially simultaneously,
   wherein a long-term decay of the reference current of the reference OTP cell is substantially matched with a long-term decay of the reference current of the OTPMBE due at least in part to said substantially simultaneous fabrication.

7. The apparatus of claim 6, wherein when the OTPMBE is on, it generates a current between 200 uA and 10 uA, and when it is off, it generates a current between 1.3 uA and 0.

8. The apparatus of claim 6, wherein the reference OTP cell and the OTPMBE both include at least one metal-oxide semiconductor FET (MOSFET), but do not include Junction gate Field Effect Transistors (JFET).

9. An apparatus, comprising:
   a reference memory logic, wherein the reference memory logic can generate a reference current when burned in;
   a current mirror coupled to an output of the reference memory logic to receive the reference current;
   a programmable memory bit (PMB) logic coupled to an input of the current mirror; and a comparator having an input coupled to a node between the PMB logic and the current mirror,
   wherein the reference memory logic and the PMB logic are fabricated substantially simultaneously.

10. The apparatus of claim 9, wherein the reference memory logic and the PMB logic are a same type of logic.

11. The apparatus of claim 9, wherein the PMB logic is an OTPMBE.

12. The apparatus of claim 9, wherein there are a plurality of PMB logics are coupleable to the reference PMB logic through employment of at least a read line.

13. The apparatus of claim 9, wherein a mirrored current of the current mirror varies in a fractional ratio to a variation of a current of the reference memory logic.

14. The apparatus of claim 9, wherein the ratio is the mirrored current is substantially one sixth to one quarter of the current of the reference memory logic.

15. The apparatus of claim 9, wherein the current mirror, the PMB logic, the reference memory logic, and the comparator are all integrated in a single integrated circuit.

16. The apparatus of claim 15, wherein the reference memory logic and the PMB logic include Metal Oxide Semiconductor Field Effect Transistor (MOSFET), but do not include Junction gate Field Effect Transistors (JFET).

* * * * *